United States Patent
Cao et al.

(10) Patent No.: US 12,332,299 B2
(45) Date of Patent: Jun. 17, 2025

(54) REMOVING TEST EQUIPMENT NOISE FROM POWER SPECTRAL DENSITY MEASUREMENTS

(71) Applicant: LitePoint Corporation, San Jose, CA (US)

(72) Inventors: Chen Cao, Shanghai (CN); Christian Volf Olgaard, Saratoga, CA (US); Ruizu Wang, Santa Clara, CA (US); Qingjie Lu, Shanghai (CN)

(73) Assignee: LitePoint Corporation, San Jose, CA (US)

( * ) Notice: Subject to any disclaimer, the term of this patent is extended or adjusted under 35 U.S.C. 154(b) by 129 days.

(21) Appl. No.: 18/144,019

(22) Filed: May 5, 2023

(65) Prior Publication Data
US 2024/0361376 A1   Oct. 31, 2024

(30) Foreign Application Priority Data
Apr. 26, 2023  (CN) .......................... 202310461854.9

(51) Int. Cl.
  *G01R 31/28*   (2006.01)
  *G01R 23/18*   (2006.01)
(52) U.S. Cl.
  CPC ......... *G01R 31/2837* (2013.01); *G01R 23/18* (2013.01); *G01R 31/2841* (2013.01)
(58) Field of Classification Search
  CPC .............. G01R 31/2837; G01R 23/18; G01R 31/2841; G01R 23/163; G01R 31/00

(Continued)

(56) References Cited

U.S. PATENT DOCUMENTS

| | | | | |
|---|---|---|---|---|
| 3,876,946 A | * | 4/1975 | La Clair | G01R 23/18 |
| | | | | 324/76.23 |
| 6,229,316 B1 | | 5/2001 | Fukui et al. | |

(Continued)

FOREIGN PATENT DOCUMENTS

| | | | | | |
|---|---|---|---|---|---|
| CN | 109633294 A | * | 4/2019 | ............. | G01R 29/26 |
| CN | 114384457 A | * | 4/2022 | ........... | G01R 35/005 |
| CN | 114966293 A | * | 8/2022 | | |

OTHER PUBLICATIONS

Extended European Search Report issued in EP24158142.0, dated Jul. 22, 2024 (11 pages).

(Continued)

*Primary Examiner* — Tung X Nguyen
*Assistant Examiner* — Robert P Alejnikov, Jr.
(74) *Attorney, Agent, or Firm* — ArentFox Schiff LLP

(57) ABSTRACT

An example method includes the following operations: (i) receiving a device signal from a device under test (DUT); (ii) setting an attenuation value; (iii) applying the attenuation value to the device signal to produce an attenuated device signal for a frequency spectrum analyzing device, where the frequency spectrum analyzing device produces a noise signal; (iv) obtaining a power spectral density value using the frequency spectrum analyzing device, where a power spectral density comprises a power, at a frequency value, of a combined signal that is based on the attenuated device signal and the noise signal; (v) repeating operations (ii), (iii), and (iv) one or more times to produce multiple power spectral density values; (vi) repeating operations (i), (ii), (iii), (iv), and (v) one or more times to add power spectral density values to the multiple power spectral density values; and (vii) obtaining a power spectral density of the device signal.

23 Claims, 4 Drawing Sheets

(58) Field of Classification Search
USPC .......................................................... 324/612
See application file for complete search history.

(56) References Cited

U.S. PATENT DOCUMENTS

| | | | |
|---|---|---|---|
| 6,542,740 B1 | 4/2003 | Olgaard et al. | |
| 7,093,017 B1 | 8/2006 | Olgaard et al. | |
| 7,167,682 B1 | 1/2007 | Madsen et al. | |
| 7,363,188 B1 | 4/2008 | Olgaard et al. | |
| 7,457,712 B1 | 11/2008 | Madsen et al. | |
| 7,457,995 B1 | 11/2008 | Madsen et al. | |
| 7,484,146 B2 | 1/2009 | Olgaard et al. | |
| 7,519,383 B2 | 4/2009 | Olgaard | |
| 7,564,896 B2 | 7/2009 | Olgaard | |
| 7,567,521 B2 | 7/2009 | Olgaard et al. | |
| 7,772,922 B1 | 8/2010 | Olgaard et al. | |
| 8,036,617 B2 | 10/2011 | Olgaard | |
| 8,189,483 B2 | 5/2012 | Olgaard et al. | |
| 8,780,966 B1 | 7/2014 | Olgaard et al. | |
| 8,879,659 B1 | 11/2014 | Olgaard | |
| 9,015,538 B2 | 4/2015 | Olgaard | |
| 9,077,535 B2 | 7/2015 | Olgaard | |
| 9,116,187 B1 * | 8/2015 | Owen .................... | G01R 27/28 |
| 9,497,101 B2 | 11/2016 | Olgaard et al. | |
| 9,749,065 B2 | 8/2017 | Olgaard et al. | |
| 9,749,066 B2 | 8/2017 | Olgaard et al. | |
| 9,780,893 B2 | 10/2017 | Olgaard | |
| 9,794,009 B1 | 10/2017 | Olgaard et al. | |
| 9,825,717 B2 | 11/2017 | Olgaard et al. | |
| 9,871,601 B2 | 1/2018 | Olgaard et al. | |
| 9,923,647 B1 | 3/2018 | Olgaard et al. | |
| 10,009,126 B2 | 6/2018 | Olgaard et al. | |
| 10,079,626 B1 | 9/2018 | Olgaard et al. | |
| 10,084,555 B1 | 9/2018 | Olgaard et al. | |
| 10,097,282 B1 | 10/2018 | Chao et al. | |
| 10,326,540 B2 | 6/2019 | Olgaard et al. | |
| 10,404,609 B2 | 9/2019 | Cao et al. | |
| 10,536,226 B1 | 1/2020 | Huynh et al. | |
| 10,666,538 B2 | 5/2020 | Olgaard | |
| 10,666,542 B1 | 5/2020 | Olgaard et al. | |
| 10,819,616 B2 | 10/2020 | Olgaard et al. | |
| 11,032,725 B1 | 6/2021 | Olgaard et al. | |
| 11,598,803 B1 | 3/2023 | Cao et al. | |
| 11,742,970 B1 | 8/2023 | Cao et al. | |
| 11,817,913 B1 | 11/2023 | Cao et al. | |
| 11,835,563 B2 | 12/2023 | Huynh et al. | |
| 11,838,776 B2 | 12/2023 | Olgaard et al. | |
| 11,855,707 B2 | 12/2023 | Cao et al. | |
| 2007/0070691 A1 | 3/2007 | Walvis et al. | |
| 2007/0070881 A1 | 3/2007 | Olgaard et al. | |
| 2007/0243825 A1 | 10/2007 | Olgaard et al. | |
| 2008/0127008 A1 | 5/2008 | Bouas et al. | |
| 2008/0172588 A1 | 7/2008 | Olgaard | |
| 2008/0285467 A1 | 11/2008 | Olgaard | |
| 2008/0287117 A1 | 11/2008 | Olgaard et al. | |
| 2008/0293363 A1 | 11/2008 | Olgaard | |
| 2008/0320345 A1 | 12/2008 | Olgaard | |
| 2009/0092053 A1 | 4/2009 | Olgaard | |
| 2009/0307331 A1 | 12/2009 | Olgaard et al. | |
| 2009/0319826 A1 | 12/2009 | Olgaard et al. | |
| 2010/0007355 A1 | 1/2010 | Olgaard et al. | |
| 2010/0008237 A1 | 1/2010 | Olgaard et al. | |
| 2010/0123471 A1 | 5/2010 | Olgaard et al. | |
| 2010/0156438 A1 * | 6/2010 | Gorin .................... | G01R 23/16 324/624 |
| 2010/0261431 A1 | 10/2010 | Olgaard | |
| 2011/0069624 A1 | 3/2011 | Olgaard | |
| 2011/0090799 A1 | 4/2011 | El-Hassan et al. | |
| 2011/0292809 A1 | 12/2011 | Olgaard et al. | |
| 2011/0314333 A1 | 12/2011 | Olgaard et al. | |
| 2012/0051224 A1 | 3/2012 | Olgaard et al. | |
| 2012/0113829 A1 | 5/2012 | Olgaard et al. | |
| 2012/0213112 A1 | 8/2012 | Olgaard et al. | |
| 2012/0269288 A1 | 10/2012 | Olgaard et al. | |
| 2013/0028100 A1 | 1/2013 | Olgaard | |
| 2013/0122845 A1 | 5/2013 | Loewenstein | |
| 2013/0188678 A1 | 7/2013 | Olgaard et al. | |
| 2013/0234728 A1 | 9/2013 | Olgaard et al. | |
| 2013/0259097 A1 | 10/2013 | Olgaard et al. | |
| 2013/0294252 A1 | 11/2013 | Olgaard et al. | |
| 2013/0294255 A1 | 11/2013 | Olgaard et al. | |
| 2013/0295858 A1 | 11/2013 | Olgaard et al. | |
| 2013/0301694 A1 | 11/2013 | Olgaard | |
| 2013/0326274 A1 | 12/2013 | Olgaard et al. | |
| 2014/0024315 A1 | 1/2014 | Olgaard et al. | |
| 2014/0169181 A1 | 6/2014 | Olgaard et al. | |
| 2014/0169182 A1 | 6/2014 | Olgaard et al. | |
| 2014/0181601 A1 | 6/2014 | Olgaard et al. | |
| 2014/0233405 A1 | 8/2014 | Olgaard | |
| 2014/0256268 A1 | 9/2014 | Olgaard | |
| 2014/0269365 A1 | 9/2014 | Olgaard et al. | |
| 2015/0036729 A1 | 2/2015 | Olgaard et al. | |
| 2015/0058691 A1 | 2/2015 | Olgaard et al. | |
| 2015/0063133 A1 | 3/2015 | Olgaard et al. | |
| 2015/0078196 A1 | 3/2015 | Olgaard | |
| 2015/0138998 A1 | 5/2015 | Olgaard et al. | |
| 2015/0139023 A1 | 5/2015 | Olgaard et al. | |
| 2015/0149839 A1 | 5/2015 | Olgaard | |
| 2015/0192639 A1 | 7/2015 | Olgaard | |
| 2015/0253357 A1 | 9/2015 | Olgaard | |
| 2015/0256274 A1 | 9/2015 | Olgaard et al. | |
| 2015/0304864 A1 | 10/2015 | Olgaard | |
| 2018/0351664 A1 | 12/2018 | Olgaard et al. | |
| 2020/0011912 A1 | 1/2020 | Quan et al. | |

OTHER PUBLICATIONS

Yannick Gruson et al: "Artifacts and errors in cross-spectrum phase noise measurements", Metrologia, Institute of Physics Publishing, Bristol, GB, vol. 57, No. 5, Aug. 19, 2020 (Aug. 19, 2020), p. 55010, XP020357094, ISSN: 0026-1394, DOI: 10.1088/1681-7575/AB8D7B.

Mark S. Oude Alink et al: "A CMOS-Compatible Spectrum Analyzer for Cognitive Radio Exploiting Crosscorrelation to Improve Linearity and Noise Performance", IEEE Transactions on Circuits and Systems I: Regular Papers, IEEE, US, vol. 59, No. 3, Mar. 1, 2012 (Mar. 1, 2012), pp. 479-492, XP011454322, ISSN: 1549-8328, DOI 10.1109/TCSI.2011.2167266.

Alan E. Rogers et al: "Extending the Dynamic Range of a Spectrum Monitor Using Comparison Switching and Spectral Averaging", IEEE Transactions on Instrumentation and Measurement, IEEE, USA, vol. 57, No. 3, Mar. 1, 2008 (Mar. 1, 2008), pp. 591-594, XP011199145, ISSN: 0018-9456, DOI: 10.1109/TIM.2007.911616.

"Draft IEEE Standard for Digitizing Waveform Recorders", IEEE Draft; IEEESTD1057SMMARKUP8_11_06, IEEE-SA, Piscataway, NJ USA, vol. 1057, Sep. 4, 2006 (Sep. 4, 2006), pp. 1-171, XP017609259.

Extended European Search Report issued in EP24159131.2, mailed Jul. 3, 2024 (10 pages).

Simon, M., "Interaction of Intermodulation Products between DUT and Spectrum Analyzer: White Paper," Rohde & Schwarz, Application Note (Dec. 2012), 1MA219_2e, 16 pages.

Kearney et al., "Passive Intermodulation (PIM) Effects in Base Stations: Understanding the Challenges and Solutions," Analog Devices, Analog Dialogue 51-03, URL: https://www.analog.com/en/analog-dialogue/articles/passive-intermodulation-effects-in-base-stations-understanding-the-challenges-and-solutions.html (Mar. 2017), 5 pages.

Non-Final Office Action received for U.S. Appl. No. 18/143,886, mailed on Dec. 17, 2024, 15 pages.

* cited by examiner

REMOVING TEST EQUIPMENT NOISE FROM POWER SPECTRAL DENSITY MEASUREMENTS

CROSS-REFERENCE TO RELATED APPLICATIONS

This application claims priority to Chinese patent application number 202310461854.9 which was filed on Apr. 26, 2023. The contents of Chinese patent application number 202310461854.9 are incorporated herein by reference.

TECHNICAL FIELD

This specification describes example implementations of techniques for removing test equipment noise from power spectral density measurements of a device signal.

BACKGROUND

Power spectral density, or "PSD", specifies the power levels of frequency components present in a signal. Essentially, the PSD defines the relationship between the power of a signal and the frequency of the signal.

Test equipment is configured to test the operation of electronic devices referred to as devices under test (DUTs). A frequency spectrum analyzing device is a component of test equipment that, among other things, is configured to measure the PSD of a signal from a DUT ("the DUT signal"). An example of a frequency spectrum analyzing device is a vector signal analyzer (VSA). During operation, the VSA adds noise to the DUT signal. In some types of VSAs, particularly older or "legacy" VSAs, the noise added by the VSA overwhelms parts of the DUT signal, making PSD measurements of the DUT signal inaccurate or not possible.

SUMMARY

An example method includes the following operations: (i) receiving a device signal from a device under test (DUT); (ii) setting an attenuation value; (iii) applying the attenuation value to the device signal to produce an attenuated device signal for a frequency spectrum analyzing device, where the frequency spectrum analyzing device produces a noise signal; (iv) obtaining a power spectral density value using the frequency spectrum analyzing device, where a power spectral density comprises a power, at a frequency value, of a combined signal that is based on the attenuated device signal and the noise signal; (v) repeating operations (ii), (iii), and (iv) one or more times to produce multiple power spectral density values; (vi) repeating operations (i), (ii), (iii), (iv), and (v) one or more times to add power spectral density values to the multiple power spectral density values; and (vii) obtaining a power spectral density of the device signal by removing at least some of the noise signal from the combined signal by performing an optimization process that is based on the multiple power spectral density values. The example method may include one or more of the following features, either alone or in combination.

The optimization process may result in a power spectral density of the noise signal and a power spectral density of the device signal. The power spectral density of the device signal may be obtained by subtracting the power spectral density of the frequency spectrum analyzing device noise signal from multiple power spectral density values.

The optimization process may include the following operations: (viii) selecting a frequency value among multiple frequency values; (ix) performing an optimization using one of the multiple power spectral density values associated with the selected frequency value; and (x) repeating operations (viii) and (ix) one or more times to obtain power spectral density values for the device signal. The optimization process may be based on a function to minimize a difference that is based on ones of the multiple power spectral density values and corresponding theoretical power spectral density values for the combined signal.

The power spectral density of the device signal may be in the frequency domain. The attenuation value may be set in a digital step attenuator (DSA). The DSA may be part of the frequency spectrum analyzing device. The DSA may be external to the frequency spectrum analyzing device.

The operations (i) to (vi) may be performed on the frequency spectrum analyzing device, on a test instrument, or on both the frequency spectrum analyzing device and a test instrument. Operation (ix) may be performed by one or more processing devices.

Each frequency value may correspond to a bin covering a span of multiple frequencies. The DUT may be, or include, network infrastructure equipment and the frequency spectrum analyzing device may be, or include, a vector signal analyzer.

An example system includes one or more apparatuses including a frequency spectrum analyzing device that produces a noise signal. The one or more apparatuses may be configured to perform operations that include: (i) receiving a device signal from a device under test (DUT); (ii) setting an attenuation value; (iii) applying the attenuation value to the device signal to produce an attenuated device signal for a frequency spectrum analyzing device, where the frequency spectrum analyzing device produces a noise signal; (iv) obtaining a power spectral density value using the frequency spectrum analyzing device, where a power spectral density comprises a power, at a frequency value, of a combined signal that is based on the attenuated device signal and the noise signal; (v) repeating operations (ii), (iii), and (iv) one or more times to produce multiple power spectral density values; and (vi) repeating operations (i), (ii), (iii), (iv), and (v) one or more times to add power spectral density values to the multiple power spectral density values. The one or more apparatuses include one or more processing devices configured to perform operations that include (vii) obtaining a power spectral density of the device signal by removing at least some of the noise signal from the combined signal by performing an optimization process that is based on the multiple power spectral density values. The system may include one or more of the following features, either alone or in combination.

The optimization process may result in a power spectral density of the noise signal and a power spectral density of the device signal. The power spectral density of the device signal may be obtained by subtracting the power spectral density of the noise signal from the multiple power spectral density values.

The optimization process may include the following operations: (viii) selecting a frequency value among multiple frequency values; (ix) performing an optimization on ones of the multiple power spectral density values associated with the selected frequency value; and (x) repeating operations (viii) and (ix) one or more times to obtain power spectral density values for the device signal. The optimization process may be based on a function to minimize a difference that is based on ones of the multiple power spectral density values and corresponding theoretical power spectral density values for the combined signal.

The power spectral density of the device may be is in the frequency domain. The one or more apparatuses may include a DSA to set the attenuation value and the spectrum signal analyzer. The DSA may be part of the frequency spectrum analyzing device. The DSA may be external to the frequency spectrum analyzing device. The DSA being may be between the DUT and the frequency spectrum analyzing device.

The one or more processing devices may be part of the frequency spectrum analyzing device. The system may include a test instrument that includes at least one of the apparatus or the one or more processing devices.

Each frequency value may correspond to a bin covering a span of multiple frequencies. The DUT may be, or include, network infrastructure equipment and the frequency spectrum analyzing device may be, or include, a vector signal analyzer.

Any two or more of the features described in this specification, including in this summary section, may be combined to form implementations not specifically described in this specification.

At least part of the apparatuses, devices, systems, and processes described in this specification may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the apparatuses, devices, systems, and processes described in this specification may be configured or controlled using a computing system comprised of one or more processing devices and memory storing instructions that are executable by the one or more processing devices to perform various control operations. The apparatuses, devices, systems, and processes described in this specification may be configured, for example, through design, construction, composition, arrangement, placement, programming, operation, activation, deactivation, and/or control.

The details of one or more implementations are set forth in the accompanying drawings and the following description. Other features and advantages will be apparent from the description and drawings, and from the claims.

DESCRIPTION OF THE DRAWINGS

Like reference numerals in different Figures indicate like elements.

DETAILED DESCRIPTION

Described herein are examples example implementations of techniques for removing test equipment noise from power spectral density (PSD) measurements of a signal from a device under test (DUT) ("the DUT signal") containing test equipment noise. The techniques are described in the context of removing noise added to the DUT signal by vector signal analyzer (VSA), which is a type of frequency spectrum analyzing device (e.g., a spectrum analyzer). However, the techniques may be used to remove noise added by any hardware used in test equipment for measuring any frequency spectrum, or other, signals including, but not limited to, other types of frequency spectrum analyzing devices, such as a direct sampling scope.

With respect to VSA noise, the VSA's noise floor may be defined as the lowest power DUT signal that the VSA can measure due to noise added to the DUT signal by the VSA. When part of a DUT signal is near or below the VSA's noise floor, which can be the case for dynamic range signals, particularly signals having parts that are 50 decibels (dB), 60 dB, 70 dB or lower than the main part of the DUT signal, PSD measurements may be distorted by the VSA noise. The techniques described herein may have advantages in that they remove at least some of the VSA noise from the PSD measurements of the DUT signal containing test equipment noise, thereby enabling PSD measurements using legacy (e.g., older) VSAs that were not designed to produce noise levels that enable PSD measurements of low power parts of a DUT signal.

The techniques described herein have general applicability, but may have particular applicability to infrastructure equipment such as base stations or micro stations. In this regard, an issue with infrastructure equipment is that noise from one frequency channel can be radiated into one or more other frequency channels. The processes described herein enable PSD measurements of the base station or micro station signals in the presence of VSA noise.

Figure 1:
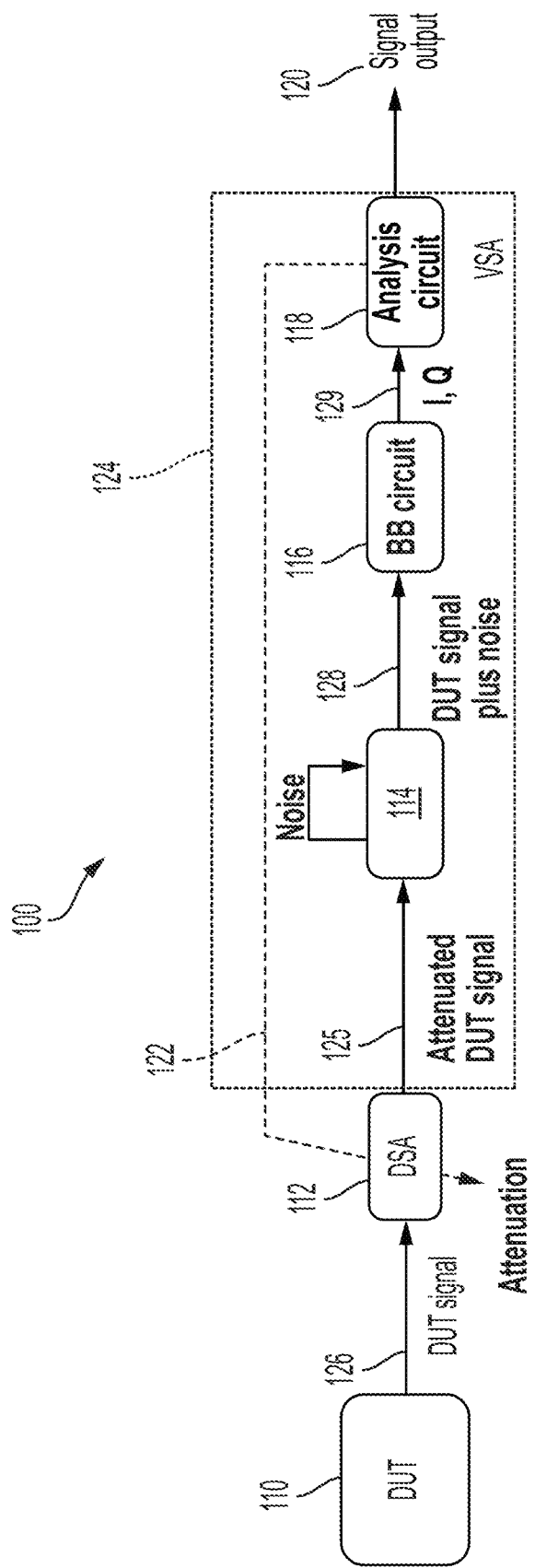
FIG. 1 is a block diagram of a model of example hardware configured to remove test equipment noise from power spectral density (PSD) measurements of a signal from a device under test (DUT).

FIG. 1 is a block diagram of an example system 100 on which the example techniques described herein may be implemented. System 100 is, or is part of, test equipment that is configured to test DUT 110 by measuring signals from the DUT. DUT 110 may be any appropriate type of electronic device, examples of which include, but are not limited to, infrastructure equipment such as the devices described above.

System 100 includes digital step attenuator (DSA) 112. DSA 112 is a hardware device that is configured to apply a controlled amount of attenuation to a signal, such as a high frequency radio frequency (RF) DUT signal, e.g., without adding noise. Signal attenuation includes the reduction or loss of communication signal strength during transmission. The amount of attenuation that can be applied by DSA 112 is digitally controlled, e.g., by analysis circuit 118 described below. The attenuation applied by DSA 112 may be applied in steps to signals from DUT 110. In some implementations, the steps may be on the order of ½ dB, although other step sizes such as ¼ dB, ¾ dB, or 1 dB may be used. In some implementations, the attenuation is applied to each DUT signal over a range of 1 dB to 3 dB; however, these ranges may be different for different DUTs and different configurations of test equipment. For example, the ranges may be from 0.5 dB to 2.5 dB, from 2 dB to 6 dB, and so forth. The variation on the range depends on number of measurements needed to implement the noise removal techniques described herein. For example, for a very low power signal component, 20 to 40 measurements at two or more attenuation steps, may be used. For a higher power signal component, measurements at less than 20 attenuation steps may be used, resulting in a corresponding number of measurements per signal.

In some implementations, DSA 112 is part of/internal to the VSA 124. In this example, the DSA 112 and the VSA 124 are part of the same apparatus. In some implementations, the DSA is not part of/external to the VSA, as shown in FIG. 1. In this example, the DSA 112 and the VSA 124 are different apparatus. In both examples, the DSA is between the DUT 110 and an analysis circuit 118 of the VSA.

In this example, DSA 112 is configured to receive a signal 126 from DUT 110. The DUT signal may be a high-speed signal—for example, a signal having frequencies in the GHz range—although any type of signals, including low frequency signals, may be received. Signal 126 may be an RF signal having parts (also referred to as components or portions) thereof that are at relatively low power, such as described above. DSA 112 is configured to apply an attenuation value (e.g., a step value) to the DUT signal to produce an attenuated DUT signal 125.

VSA 124 is a hardware device that is configured to perform PSD measurements based on the attenuated DUT signal 125. In this example, VSA 124 is noisy. Noise from the VSA is added to the attenuated DUT signal 125. This noise is represented conceptually by block 114. Note that block 114 is not an actual device or component of VSA 124, but rather just a physical representation of the VSA noise. The amount of noise added to attenuated DUT signal 125 is based on the type of VSA used. In some implementations, the power of the noise added is greater than the power of all or part of attenuated DUT signal 125. In some implementations, the power of the noise added is less than the power of all or part of the attenuated DUT signal 125. The relationship between the noise added and the attenuated DUT signal 125 DUT signal may vary based on the amount of attenuation applied to the original DUT signal 126. The VSA noise may remain constant over a small attenuator range. In some implementations, for attenuations, the VSA noise is constant over a range of attenuator settings such as the attenuations and ranges described herein. The DUT signal seen by VSA 124 will vary (e.g., increase and/or decrease in power) with variations in the attenuation.

Baseband (BB) circuit 116 is configured to receive the attenuated DUT signal plus noise 128 from the VSA. BB circuit 116 may be a baseband processor that is configured to synthesize a digitized baseband representation based on received signal 128. Specifically, to transmit a signal, the signal may be compiled into the baseband representation, such as in-phase (I) and quadrature (Q) samples. These components, which are the digitized baseband representation 129, are the output of BB circuit 116. The baseband representation decreases with increases in attenuation from DSA 112 and increase with decreases in attenuation from DSA 112. Thus, the baseband representation is correlated with the original DUT signal 126.

Analysis circuit 118 may be, or include, one or more processing devices, such as one or more controllers or one or more microprocessors as described herein. In some implementations, analysis circuit 118 is configured—for example, programmed—to perform the operations described herein for removing at least some (e.g., all or less than all) VSA noise from a PSD measurement. In some implementations, analysis circuit 118 is configured to provide, to an external computing device, data used to perform the operations described herein for removing at least some VSA noise from the PSD measurement of a DUT signal.

Figure 2:
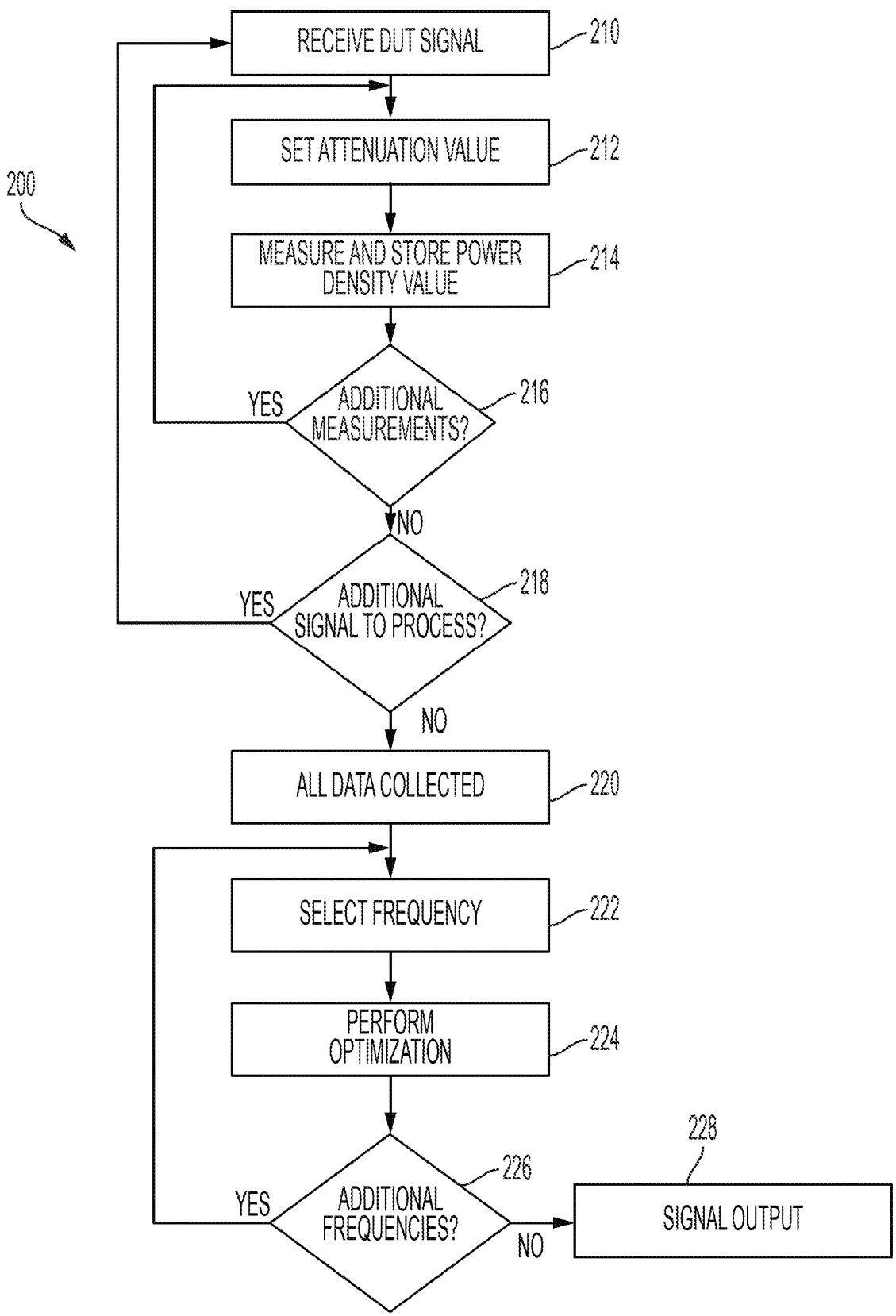
FIG. 2 is a flowchart showing operations included in an example process for removing test equipment noise from PSD measurements of the DUT signal.

FIG. 2 shows operations included in an example process 200 for removing all or some VSA noise from the PSD measurement of a DUT signal. Process 200 includes operations 210 to 220 for collecting data based on actual PSD measurements of one or more DUT signals for different DSA attenuation values, and operations 222 to 226 for performing an optimization process to remove all or some (e.g., at least some) VSA noise from PSD measurements of one or more DUT signals.

According to example process 200, DSA 112 receives (210) a signal from a DUT, such as DUT 110 of FIG. 1. In some implementations, the signal may include a low power, high frequency component of an RF signal—for example, a portion of an RF signal having a frequency in the GHz range and having a power of 50 dB or less, 60 dB or less, and so forth relative to a main portion of the RF signal. An attenuation value is set in, e.g., programmed into, DSA 112. This may be done, for example, by analysis circuit 118 based on a number of PSD measurements to be obtained by the VSA. For example, if greater numbers of PSD measurements are to be obtained, then the attenuation value and steps thereof may be set relatively low, for example, on the order of ½ dB step size over a range of 1 dB to 3 dB, whereas if fewer numbers of PSD measurements are to be obtained, the attenuation step size may be set to a higher value. The step size and the range may be varied to obtain any desired number of PSD measurements. Many different attenuator settings may be used and multiple measurements may be repeated at any given attenuator setting. In a particular non-limiting example, five attenuator settings may be used to obtain two measurements per attenuator setting.

As explained previously, the VSA introduces noise into the attenuated DUT signal 125. Thereafter, the attenuated DUT signal containing VSA noise is synthesized into a baseband representation by BB circuit 116. Analysis circuit 118 measures (214) the PSD of the attenuated DUT signal plus noise 128 using the digitized baseband representation 129. The resulting PSD value(s) are stored in memory. The values constitute individual PSD values measured in dBm (decibel-milliwatts), each measured at a resolution bandwidth (RBW). The RBW is the frequency step size at which the PSD measurements are measured. The values may be stored in bins in the memory, with each bin corresponding to an RBW.

Process 200 determines (216) whether there are additional measurements to obtain for a current DUT signal plus noise. Whether additional measurements are to be obtained is based on whether, statistically, there are enough measurements to determine the VSA noise. This determination may also be based on the step size and the range over which the PSD values are measured. For example, if the step size is ½ dB, the range is from 1 dB to 3 dB, and the current value in the range is 1.5 dB, then there may be no additional attenuation values to process. Conversely, if the current value in the range is 3 dB, then there may be no additional attenuation values to process for the current DUT signal. Operations 212 to 216 may be repeated until all enough measurements have been obtained.

Process 200 determines (218) whether there are additional DUT signals to process. The number of DUT signals to process may be programmed into the analysis circuit 118 or a control system for the test equipment (described below). Greater numbers of signals processed produces additional data. The more data that is processed, the greater the accuracy that the VSA noise removal techniques described herein may be, at least in some implementations. Operations 210 to 218 may be repeated until all DUT signals have been processed.

If all DUT signals have been processed (218) for and all measurements obtained (216), then all data has been collected (220) for this example of removing all or some VSA noise from the PSD measurement of a DUT signal.

Process 200 then performs an optimization process based on the collected data (220) in order to remove the VSA noise from the PSD measurement of the DUT signal across frequencies spanning the frequency bins described above. Process 200 selects (222) a frequency, f, and performs the optimization (224) to obtain a PSD value for the frequency, f. In some implementations, the optimization is or includes a regression optimization; however, other types of optimizations or processes may be used. An example optimization that may be performed in operation 224 is described as follows.

The DUT signal power ($P_f(A)$) at frequency, f, having a power attenuation according to a scaling factor, A, is a combination of a DUT signal $x_{DUT,f}(t)$ at frequency, f, and VSA noise $x_{VSA,f}(t)$ at frequency, f. The VSA noise is the noise added to the DUT signal by the VSA as described herein. $P_f(A)$ is defined as follows.

$$P_f(A) = \int_t \left(A^{1/2} x_{DUT,f}(t) + x_{VSA,N,f}(t)\right)^2 =$$

$$A \int_t x_{DUT,f}^2(t) + \int_t x_{VSA,N,f}^2(t) + 2A^{1/2} \int_t x_{DUT,f}(t) x_{VSA,N,f}(t)$$

Since the DUT signal is uncorrelated to the VSA noise, the following holds true:

$$\int_t x_{DUT,f}(t) x_{VSA,N,f}(t) = 0$$

Then, the overall DUT signal power at frequency, f, can be expressed as:

$$P_f(A) = P_{VSA,N,f} + A P_{DUT,f} \qquad (1)$$

In equation (1) above, A is a scaling factor that produces a level of attenuation (e.g., where A being 1 means no attenuation and A being 0 means complete attenuation), $P_{VSA,N,f}$ is the PSD of the noise introduced by the VSA at frequency, f, and $P_{DUT,f}$ is the DUT signal, e.g., the transmitted power signal of the DUT including an ideal DUT signal and any noise introduced into the ideal DUT signal by the DUT (e.g., signal 125 of FIG. 1). $P_{vsa,N,f}$ should remain constant independent of the attenuator setting, whereas the $P_{DUT,f}$ will vary based on the attenuator settings. Using the mathematical model of equation (1) above, an optimization, such as a regression optimization, is performed (224) on the measured power data instance at different attenuations, to disassemble the power, $P_f(A)$, into each component $P_{VSA,N,f}$ and $P_{DUT,f}$.

Using the data that has been collected (220)—referred to as the real measurement data instances. $\hat{P}_{f,A}$—the regression optimization problem can be constructed as follows for the frequency, f:

$$\min_{P_{VSA,N,f}, P_{DUT,f}} \sum_{\hat{P}_{f,A}} \left(P_f(A) - \hat{P}_{f,A}\right)^2 \qquad (2)$$

In equation (2) above, $P_f(A)$ is the PSD of the DUT signal $P_{DUT,f}$ at frequency, f, containing VSA noise $P_{VSA,N,f}$ determined mathematically by equation (1) above, and $\hat{P}_{f,A}$ are the PSD values that have been collected and stored in operations 310 to 320 above. The optimization of equation (2) can be solved at frequency, f, using a linear analytical solution. The optimization uses the function shown above to minimize a difference between $P_f(A)$ and $\hat{P}_{f,A}$. The output of the optimization of equation (2) is the PSD of the VSA noise, $P_{VSA,N,f}$, and the PSD of the DUT signal, $P_{DUT,f}$. The PSD of the DUT signal at frequency, f, having the VSA noise contribution removed may be obtained by subtracting the PSD of the noise signal, $P_{VSA,N,f}$, from the PSD of the DUT signal $P_{DUT,f}$ to which VSA noise has been added; in other words, containing VSA noise. In this example, the DUT noise remains in the DUT signal.

Thereafter, if a new frequency among the frequency bins is to be selected (226), for example if all $\hat{P}_{f,A}$ data for all frequency bins has not been processed, processing returns to operation 322. Frequency selection (222) and optimization (224) may be repeated one or more times to remove all or some VSA noise from the PSD measurements of each DUT signal over a frequency range that spans the frequency bins. The resulting DUT PSD having the VSA noise removed thus may be obtained over multiple frequencies. A signal representing the DUT PSD having all or some VSA noise removed (labeled 120 in FIG. 1) may be output at operation 228. In some implementations, the VSA noise contribution, $P_{VSA,N,f}$, may be output alternatively or in addition to the DUT PSD signal having the VSA noise removed.

Figure 3:
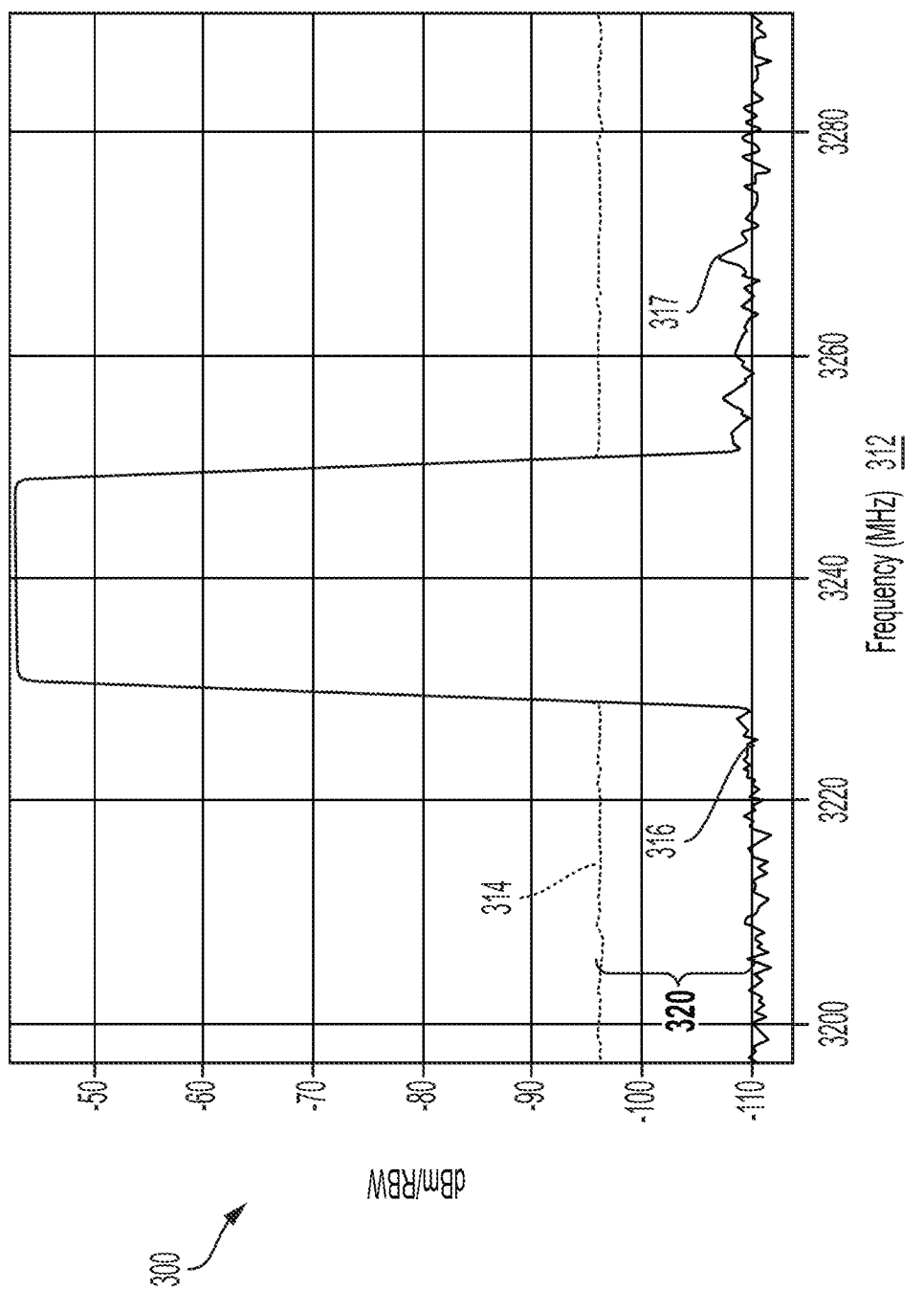
FIG. 3 is a graph showing a comparison of example PSD measurements for a DUT signal containing test equipment noise superimposed on the PSD measurements for the same DUT signal having the test equipment noise removed using the example process of FIG. 2.

FIG. 3 is a graph 300 showing a comparison of a DUT PSD signal 316 having the VSA noise removed by process 200 of FIG. 2, superimposed on an original PSD signal 314 measured for the DUT that contains VSA noise. The two PSD signals are plotted over a frequency range 312 of slightly below 3300 megahertz (MHz) up to about 3200 MHz. As shown, process 200 reduces the amount of noise 320 in portions of the DUT PSD measurements by more then 10 dB in this example—from about −96 dBm/MHz to about −110 dBm/MHz. The amount of noise reduction will vary for different DUTs. As shown in the figure, a small noise bump remains at part 317 of signal 316, thus illustrating the original DUT signal is preserved Among the advantages of example process 200 is that it is dynamic. For example, removal of the VSA noise occurs during PSD measurements. As a result, the noise being removed is the actual noise added to the DUT signal, which may result in more accurate PSD measurements by the VSA.

Figure 4:
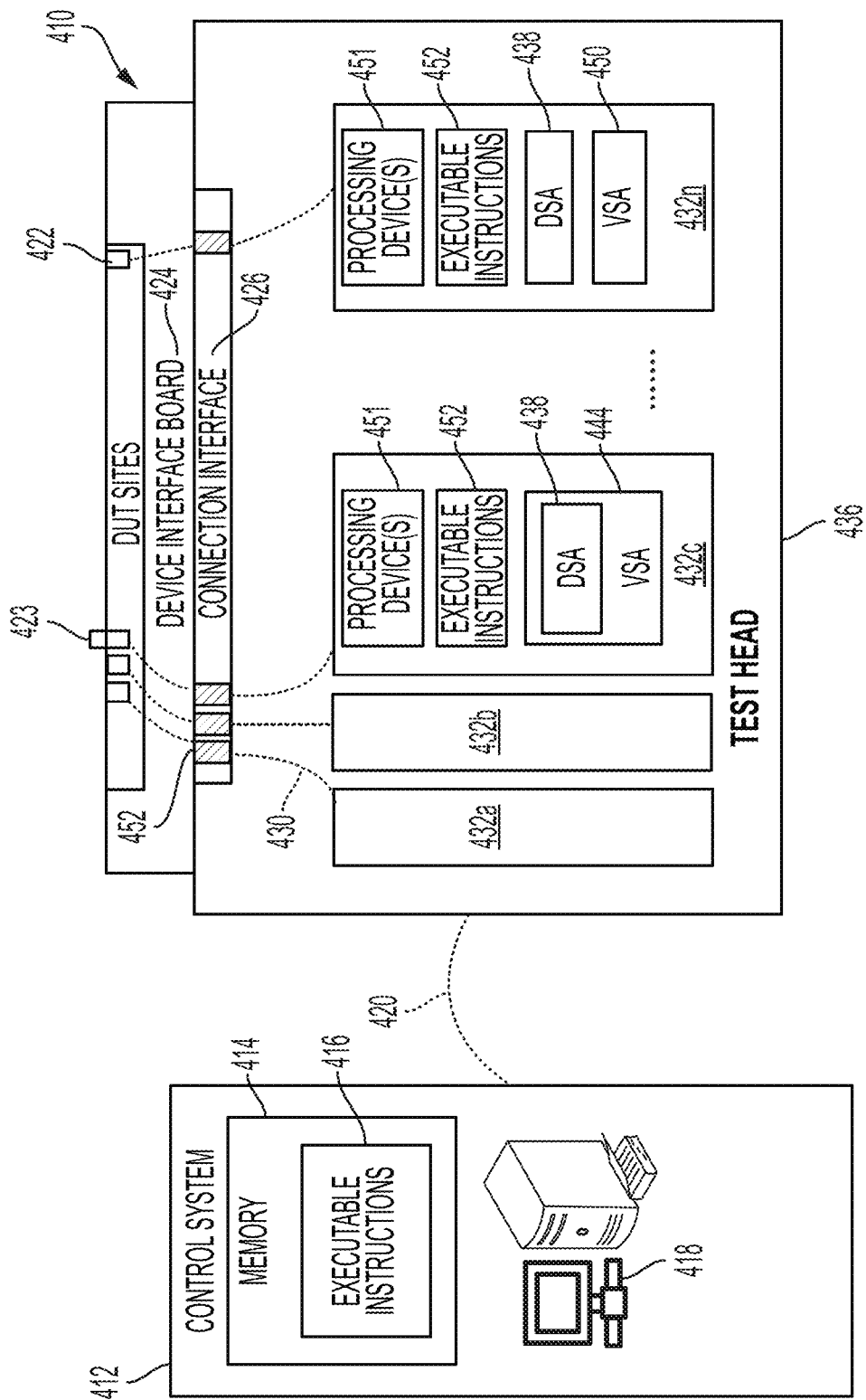
FIG. 4 is a block diagram showing components of an example test system on which the apparatuses, devices, systems, and processes described herein may be implemented.

FIG. 4 is a block diagram showing components of automatic test equipment (ATE) 400 on which the systems and processes described herein may be implemented. ATE 400 includes a testing device ("tester") 410 and a control system 412. ATE 400 may be, or include, an implementation of test equipment 124 of FIG. 1.

Tester 410 includes a test head 436 and a device interface board (DIB) 424 connected physically and electrically to test head 410. In this example, DIB 424 includes a circuit board that includes mechanical and electrical interfaces at sites 422. One or more DUTs, such as DUT 423 which may be an example of DUT 110 (FIG. 1), connect to each of those sites for testing by the ATE. DIB 424 may include, among other things, connectors, conductive traces, conductive layers, and circuitry for routing signals between test instruments in the test head 410, DUTs connected to DIB sites, and other circuitry in the ATE. Power, including voltage, may be run via one or more layers in the DIB to DUTs connected to the DIB.

Test head 410 includes multiple test instruments 432a to 432n, each of which may be configured, as appropriate, to implement testing and/or other functions. Although only four test instruments are shown, ATE 400 may include any appropriate number of test instruments, including one or more residing outside of test head 410. The test instruments may be hardware devices that may include one or more processing devices and/or other circuitry. The test instruments may be configured—for example, programmed—to output commands to test DUTs held on the DIB. The commands to test the DUTs may be or include instructions, signals, data, parameters, variables, test patterns, and/or any other information designed to elicit response(s) from the DUT. Commands to test a DUT may be generated by executing or interpreting, on a test instrument, test program(s) received by ATE 400 from an external system. In an example, a test program may be or include a set of commands that are executed or interpreted to produce commands that the test instrument uses to test the DUT.

One or more—for example, all of—the test instruments may be configured to receive, from the DUT, responses to the commands sent from the test instruments to the DUT. The responses may include the DUT signals (e.g., signal 126) described herein with respect to FIG. 1. The test instruments may be configured to perform measurements on the DUT signals to determine, among other things, spectrum measurements, such as PSD measurements using the techniques described herein with respect to FIGS. 1 to 3 to remove all or some VSA noise from the PSD measurement of a DUT signal.

To this end, each test instrument may include one or more processing devices 451, examples of which are described herein, and memory storing machine-executable instructions 452 that are executable by the processing device(s) to implement the VSA noise removal and data collection operations of process 200. Processing device(s) 451 may be implementations of the analysis circuit 118 of FIG. 1.

Each test instrument may also include the hardware of FIG. 1, including a DSA, a VSA, and a baseband circuitry (not shown). In this regard, in the example of FIG. 4, test instrument 432c includes a DSA 438, which may be an implementation of DSA 112 of FIG. 1, inside VSA 444. In the example of FIG. 4, test instrument 432n includes a DSA 438, which may be an implementation of DSA 112 of FIG. 1, outside VSA 450 as in FIG. 1. VSAs and DSAs may also be present in either configuration in test instruments 432a and 432b for performing the techniques described herein to remove all or some VSA noise from the PSD measurement of a DUT signal containing VSA noise.

Individual ones to the test instruments may be configured to perform the techniques described herein to remove all or some VSA noise from the PSD measurement of a DUT signal containing VSA noise, or two or more the test instruments may be configured to operate together to perform the techniques described herein to remove all or some VSA noise from the PSD measurement of a DUT signal containing VSA noise. In some implementations, the data to perform the techniques, such as $\hat{P}_{f,A}$, described above, may be obtained by a test instrument or multiple test instruments and then sent to the control system (described below) to perform the optimization used to remove all or some VSA noise from the PSD measurement of a DUT signal containing VSA noise, as described with respect to equations (1) and (2) above. In some implementations, processing to perform the techniques described herein to remove all or some VSA noise from the PSD measurement of a DUT signal containing VSA noise may be distributed across two or more test instruments and/or the control system.

Test channels 430 are configured between the test head 436 and the DIB to enable communication between the DUTs and the test instruments A connection interface board 426 may route those signals.

Control system 412 is configured—e.g., programmed to—to communicate with test instruments 432a to 432n to direct and/or to control testing of the DUTs. In some implementations, this communication 420 may be over a computer network or via a direct connection such as a computer bus or an optical medium. In some implementations, the computer network may be, or include, a local area network (LAN) or a wide area network (WAN). The control system may be or include a computing system comprised of one or more processing devices 418 (e.g., microprocessor(s)) and memory 414 for storage of executable instructions 416. Control system 412 may be configured to provide test programs and/or commands to test instruments 432a to 432n in the test head, which the test instrument(s) use to test the DUT. Control system 412 may be configured—e.g., programmed—to perform the optimization used to remove all or some VSA noise from the PSD measurement of a DUT signal containing VSA noise, as described with respect to equations (1) and (2) above. In particular, control system 412 may be configured to receive data, such as $\hat{P}_{f,A}$, from the test instruments and to perform the optimization used to remove all or some VSA noise from the PSD measurement of a DUT signal containing VSA noise, as described with respect to equations (1) and (2) above.

In some implementations, control system 412 may be configured—e.g., programmed—to receive a DUT signal having a VSA noise contribution removed (e.g., signal 120 of FIG. 1) by one or more test instrument(s) and to process that signal to determine whether the DUT has passed or failed testing.

All or part of the apparatuses, devices, systems, and processes described herein including but not limited to system 200 and process 300, and their various modifications may be configured and/or controlled at least in part by one or more processing devices using one or more computer programs tangibly embodied in one or more information carriers, such as in one or more non-transitory machine-readable storage media. Examples of processing devices include, but are not limited to, computing devices, microprocessors, and the special purpose logic circuitry described below.

A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a network.

Actions associated with configuring or controlling the apparatuses, devices, systems, and processes described herein can be performed by one or more programmable processors executing one or more computer programs to control or to perform all or some of the operations described herein. All or part of the test systems and processes can be configured or controlled by special purpose logic circuitry, such as, an FPGA (field programmable gate array) and/or an ASIC (application-specific integrated circuit) or embedded microprocessor(s) localized to the instrument hardware.

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. A method comprising the following operations:
   (i) receiving a device signal from a device under test (DUT);
   (ii) setting an attenuation value;
   (iii) applying the attenuation value to the device signal to produce an attenuated device signal for a frequency spectrum analyzing device, the frequency spectrum analyzing device producing a noise signal;
   (iv) obtaining a power spectral density value using the frequency spectrum analyzing device, where a power spectral density comprises a power, at a frequency value, of a combined signal that is based on the attenuated device signal and the noise signal;
   (v) repeating operations (ii), (iii), and (iv) one or more times to produce multiple power spectral density values;
   (vi) repeating operations (i), (ii), (iii), (iv), and (v) one or more times to add power spectral density values to the multiple power spectral density values; and
   (vii) obtaining a power spectral density of the device signal by removing at least some of the noise signal from the combined signal by performing an optimization process that disassembles the combined signal into the power spectral density of the device signal and a power spectral density of the noise signal, the optimization process being based on the multiple power spectral density values.

2. The method of claim 1, wherein the optimization process results in a power spectral density of the noise signal and a power spectral density of the device signal; and
   wherein the power spectral density of the device signal is obtained by subtracting the power spectral density of the noise signal from the multiple power spectral density values.

3. The method of claim 1, wherein the optimization process comprises the following operations:
   (viii) selecting a frequency value among multiple frequency values;
   (ix) performing an optimization using one of the multiple power spectral density values associated with the selected frequency value; and
   (x) repeating operations (viii) and (ix) one or more times to obtain power spectral density values for the device signal.

4. The method of claim 3, wherein the optimization process is based on a function to minimize a difference that is based on ones of the multiple power spectral density values and corresponding theoretical power spectral density values for the combined signal.

5. The method of claim 1, wherein the power spectral density of the device signal is in the frequency domain.

6. The method of claim 1, wherein the attenuation value is set in a digital step attenuator (DSA), the DSA being part of the frequency spectrum analyzing device.

7. The method of claim 1, wherein the attenuation value is set in a digital step attenuator (DSA), the DSA being external to the frequency spectrum analyzing device.

8. The method of claim 1, wherein operations (i) to (vi) are performed on the frequency spectrum analyzing device; and
   wherein operation (vii) is performed by one or more processing devices.

9. The method of claim 1, wherein operations (i) to (vii) are performed on a test instrument.

10. The method of claim 1, wherein each frequency value corresponds to a bin covering a span of multiple frequencies.

11. The method of claim 1, wherein the DUT comprises network infrastructure equipment and the frequency spectrum analyzing device comprises a vector signal analyzer.

12. A system comprising:
   one or more apparatuses comprising a frequency spectrum analyzing device that produces a noise signal, the one or more apparatuses being configured to perform operations comprising:
   (i) receiving a device signal from a device under test (DUT);
   (ii) setting an attenuation value;
   (iii) applying the attenuation value to the device signal to produce an attenuated device signal for the frequency spectrum analyzing device, the frequency spectrum analyzing device producing a noise signal;
   (iv) obtaining a power spectral density value using the frequency spectrum analyzing device, where a power spectral density comprises a power, at a frequency value, of a combined signal that is based on the attenuated device signal and the noise signal;
   (v) repeating operations (ii), (iii), and (iv) one or more times to produce multiple power spectral density values; and (vi) repeating operations (i), (ii), (iii), (iv), and (v) one or more times to add power spectral density values to the multiple power spectral density values; and one or more processing devices configured to perform operations comprising:

(vii) obtaining a power spectral density of the device signal by removing at least some of the noise signal from the combined signal by performing an optimization process that disassembles the combined signal into the power spectral density of the device signal and a power spectral density of the noise signal, the optimization process being that is based on the multiple power spectral density values.

13. The system of claim 12, wherein the optimization process results in a power spectral density of the noise signal and a power spectral density of the device signal; and wherein the power spectral density of the device signal is obtained by subtracting the power spectral density of the noise signal from the multiple power spectral density values.

14. The system of claim 12, wherein the optimization process comprises the following operations:

(viii) selecting a frequency value among multiple frequency values;

(ix) performing an optimization on ones of the multiple power spectral density values associated with the selected frequency value; and (x) repeating operations (viii) and (ix) one or more times to obtain power spectral density values for the device signal.

15. The method of claim 14, wherein the optimization process is based on a function to minimize a difference that is based on ones of the multiple power spectral density values and corresponding theoretical power spectral density values for the combined signal.

16. The system of claim 12, wherein the power spectral density of the device signal is in the frequency domain.

17. The system of claim 12, wherein the one or more apparatuses comprise:

a digital step attenuator (DSA) to set the attenuation value; and the frequency spectrum analyzing device, the DSA being part of the frequency spectrum analyzing device.

18. The system of claim 12, wherein the one or more apparatuses comprises:

a digital step attenuator (DSA) to set the attenuation value; and the frequency spectrum analyzing device, the DSA being external to the frequency spectrum analyzing device.

19. The system of claim 12, wherein the one or more apparatuses comprises:

a digital step attenuator (DSA) to set the attenuation value; and the frequency spectrum analyzing device, the DSA being between the DUT and the frequency spectrum analyzing device.

20. The system of claim 12, wherein the one or more processing devices are part of the frequency spectrum analyzing device.

21. The system of claim 12, further comprising:

a test instrument comprising at least one of the apparatus or the one or more processing devices.

22. The system of claim 12, wherein each frequency value corresponds to a bin covering a span of multiple frequencies.

23. The system of claim 12, wherein the DUT comprises network infrastructure equipment and the frequency spectrum analyzing device comprises a vector signal analyzer.

* * * * *